United States Patent
Kimura et al.

(10) Patent No.: US 10,707,357 B2
(45) Date of Patent: Jul. 7, 2020

(54) SEMICONDUCTOR DEVICE

(71) Applicant: KABUSHIKI KAISHA TOSHIBA, Minato-ku (JP)

(72) Inventors: Shigeya Kimura, Yokohama (JP); Hisashi Yoshida, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/286,646

(22) Filed: Feb. 27, 2019

(65) Prior Publication Data

US 2019/0348546 A1 Nov. 14, 2019

(30) Foreign Application Priority Data

May 14, 2018 (JP) .................. 2018-092978

(51) Int. Cl.
*H01L 29/861* (2006.01)
*H01L 29/267* (2006.01)
*H01L 29/16* (2006.01)
*H01L 29/20* (2006.01)

(52) U.S. Cl.
CPC ........ *H01L 29/8611* (2013.01); *H01L 29/267* (2013.01); *H01L 29/1608* (2013.01); *H01L 29/2003* (2013.01)

(58) Field of Classification Search
CPC . H01L 29/8611; H01L 29/267; H01L 29/1608
USPC ...................................................... 257/183
See application file for complete search history.

(56) References Cited

U.S. PATENT DOCUMENTS

| 5,679,965 A * | 10/1997 | Schetzina ............. B82Y 20/00 257/103 |
| 8,786,011 B2 | 7/2014 | Yamagami et al. |
| 2002/0047124 A1* | 4/2002 | Kitabatake .......... H01L 27/0629 257/73 |
| 2002/0110945 A1* | 8/2002 | Kuramata .............. B82Y 20/00 438/36 |
| 2013/0043524 A1* | 2/2013 | Yamagami .......... H01L 27/0727 257/328 |

FOREIGN PATENT DOCUMENTS

| JP | 2008-71832 | 3/2008 |
| JP | 2010-200585 | 9/2010 |
| JP | WO2011/136272 | 11/2011 |
| JP | 2015-41763 | 3/2015 |
| JP | 2015-41766 | 3/2015 |

* cited by examiner

*Primary Examiner* — Igwe U Anya
(74) *Attorney, Agent, or Firm* — Oblon, McClelland, Maier & Neustadt, L.L.P.

(57) ABSTRACT

According to one embodiment, a semiconductor device includes a first electrode, a second electrode, a first semiconductor layer, and a second semiconductor layer. The second electrode is separated from the first electrode in a first direction. The first semiconductor layer includes n-type SiC, is provided between the first electrode and the second electrode, and is electrically connected to the first electrode. The second semiconductor layer contacts the first semiconductor layer and the second electrode, is provided between the first semiconductor layer and the second electrode, and includes n-type $Al_xGa_{1-x}N$ ($0.5 \leq x \leq 1$). A thickness of the second semiconductor layer is not less than 10 nm and not more than 1 μm.

12 Claims, 8 Drawing Sheets

SEMICONDUCTOR DEVICE

CROSS-REFERENCE TO RELATED APPLICATIONS

This application is based upon and claims the benefit of priority from Japanese Patent Application No. 2018-092978, filed on May 14, 2018; the entire contents of which are incorporated herein by reference.

FIELD

Embodiments described herein relate generally to a semiconductor device.

BACKGROUND

There is a semiconductor device such as a diode using a p-type semiconductor layer and an n-type semiconductor layer. It is desirable for the semiconductor device to have a simple structure.

DETAILED DESCRIPTION

Figure 1:
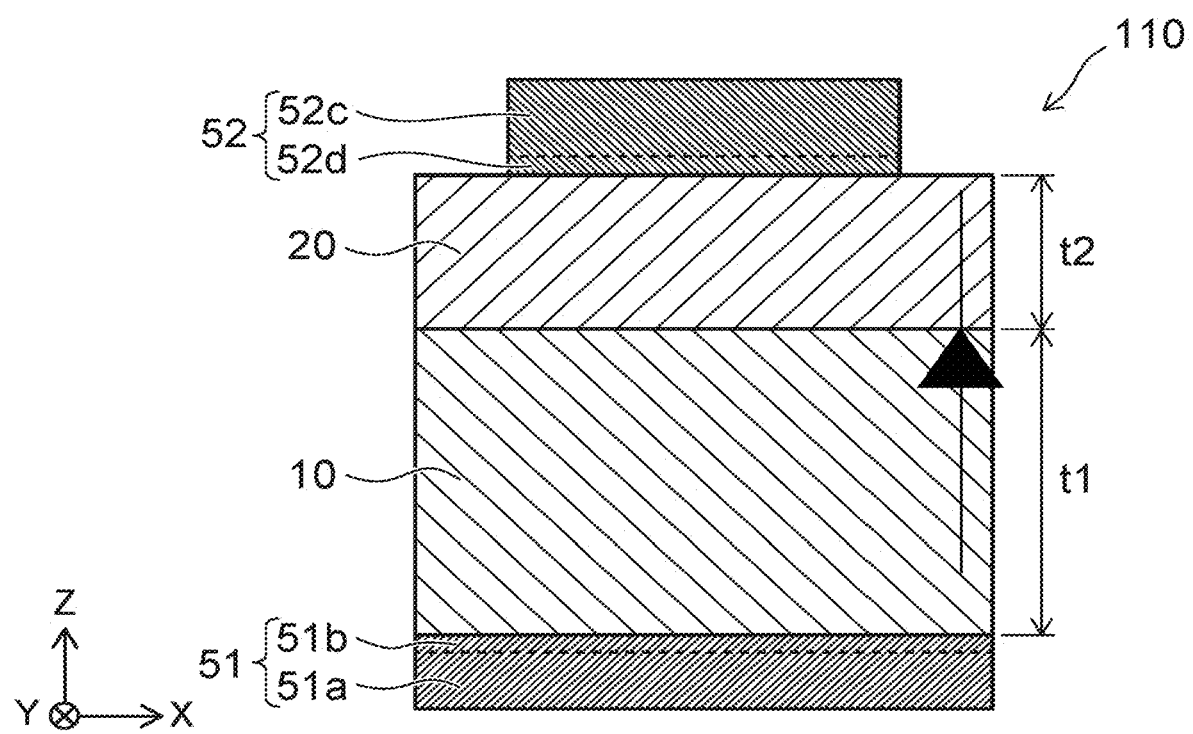
FIG. 1 is a schematic cross-sectional view illustrating a semiconductor device according to a first embodiment.

According to one embodiment, a semiconductor device includes a first electrode, a second electrode, a first semiconductor layer, and a second semiconductor layer. The second electrode is separated from the first electrode in a first direction. The first semiconductor layer includes n-type SiC, is provided between the first electrode and the second electrode, and is electrically connected to the first electrode. The second semiconductor layer contacts the first semiconductor layer and the second electrode, is provided between the first semiconductor layer and the second electrode, and includes n-type $Al_xGa_{1-x}N$ ($0.5 \leq x \leq 1$). A thickness of the second semiconductor layer is not less than 10 nm and not more than 1 μm. According to another embodiment, a semiconductor device includes a first electrode, a second electrode, a first semiconductor layer, a second semiconductor layer, and a third semiconductor layer. The second electrode is separated from the first electrode in a first direction. The first semiconductor layer includes n-type SiC, is provided between the first electrode and the second electrode, and is electrically connected to the first electrode. The second semiconductor layer contacts the first semiconductor layer, is provided between the first semiconductor layer and the second electrode, and includes n-type $Al_xGa_{1-x}N$ ($0.5 \leq x \leq 1$). A thickness of the second semiconductor layer is not less than 10 nm and not more than 1 μm. The third semiconductor layer is provided between the second semiconductor layer and the second electrode. The third semiconductor layer includes a plurality of first semiconductor films and a plurality of second semiconductor films provided alternately along the first direction. The plurality of first semiconductor films include n-type $Al_yGa_{1-y}N$ ($0 < y \leq 1$). The plurality of second semiconductor films include $Al_zGa_{1-z}N$ ($0 \leq z < y$). A thickness in the first direction of one of the plurality of first semiconductor films is not less than 1 nm and not more than 5 nm. A thickness in the first direction of one of the plurality of second semiconductor films is not less than 1 nm and not more than 10 nm.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a first semiconductor layer 10, and a second semiconductor layer 20.

The second electrode 52 is separated from the first electrode 51 in a first direction. The first direction is taken as a Z-axis direction. One direction perpendicular to the Z-axis direction is taken as an X-axis direction. A direction perpendicular to the Z-axis direction and the X-axis direction is taken as a Y-axis direction. At least a portion of the first electrode 51 and at least a portion of the second electrode 52 spread along (e.g., substantially parallel to) the X-Y plane.

The first semiconductor layer 10 is provided between the first electrode 51 and the second electrode 52. The first semiconductor layer 10 is electrically connected to the first electrode 51. The first semiconductor layer 10 includes n-type SiC. For example, the first semiconductor layer 10 includes at least one selected from the group consisting of N (nitrogen) and P (phosphorus) in addition to Si and C. N and P function as n-type impurities.

The second semiconductor layer 20 is provided between the first semiconductor layer 10 and the second electrode 52. The second semiconductor layer 20 contacts the first semiconductor layer 10 and the second electrode 52. The second semiconductor layer 20 includes n-type $Al_xGa_{1-x}N$ ($0.5 \leq x \leq 1$). The second semiconductor layer 20 includes at least one selected from the group consisting of Si, Ge, and Sn in addition to including nitrogen and at least one selected from the group consisting of Al and Ga. Si, Ge, and Sn function as n-type impurities. A thickness t2 of the second semiconductor layer 20 is not less than 10 nm and not more than 1 μm. The thickness t2 is the length along the first direction (the Z-axis direction).

As recited above, the semiconductor device 110 according to the embodiment includes the n-type first semiconductor layer 10 and the n-type second semiconductor layer 20. As described below, the semiconductor device 110 functions as a diode. The semiconductor device 110 may not include a p-type semiconductor layer. The structure of the semiconductor device 110 is simple. According to the embodiment, a semiconductor device can be provided in which the structure can be simple.

FIG. 2A to FIG. 2C and FIG. 3A to FIG. 3C are graphs illustrating characteristics of the semiconductor device according to the first embodiment.

Figure 2A:
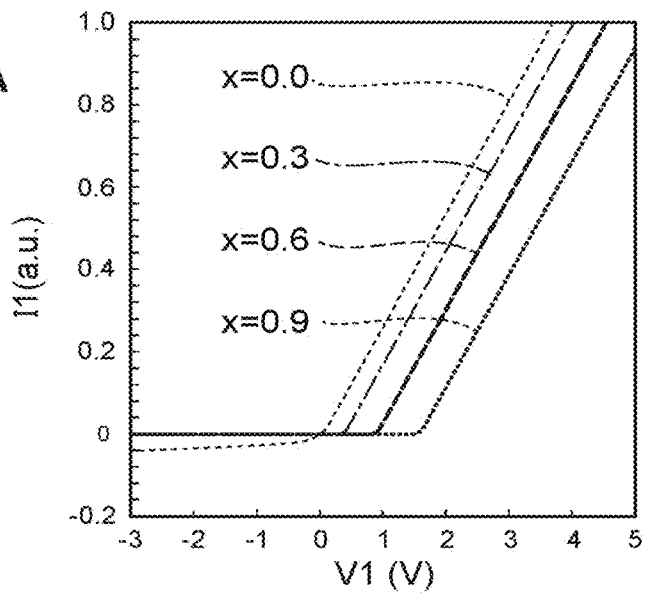
FIG. 2A to FIG. 2C are graphs illustrating characteristics of the semiconductor device according to the first embodiment.
Figure 2B:
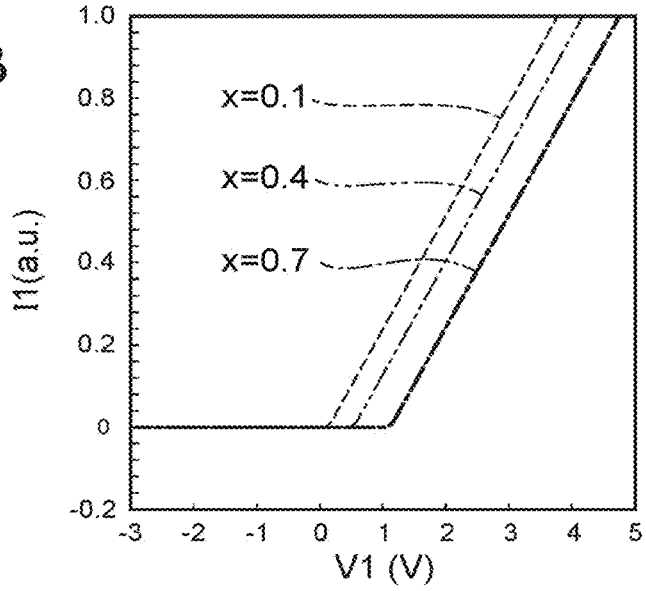
Figure 2C:
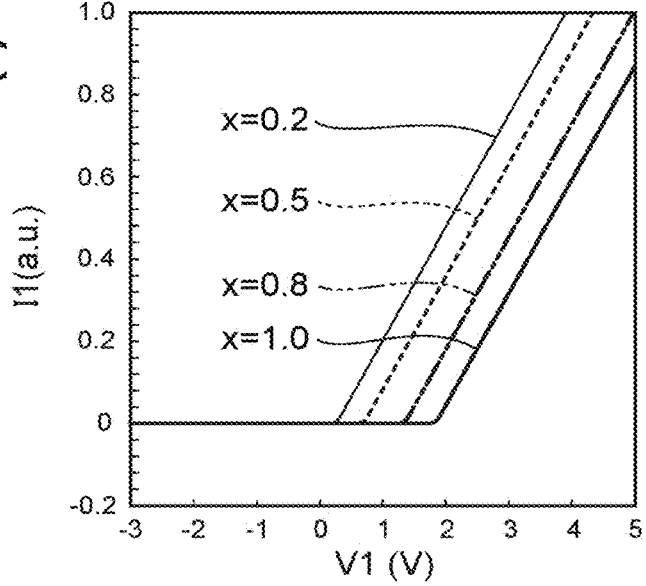
Figure 3A:
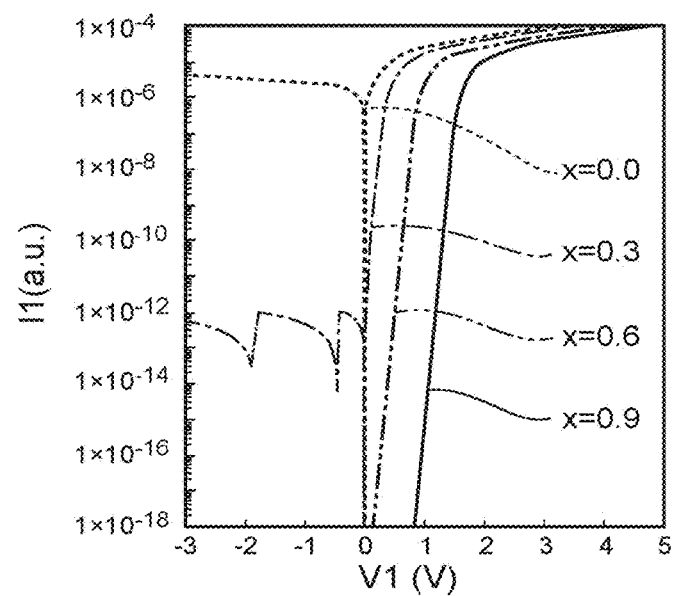
FIG. 3A to FIG. 3C are graphs illustrating characteristics of the semiconductor device according to the first embodiment.
Figure 3B:
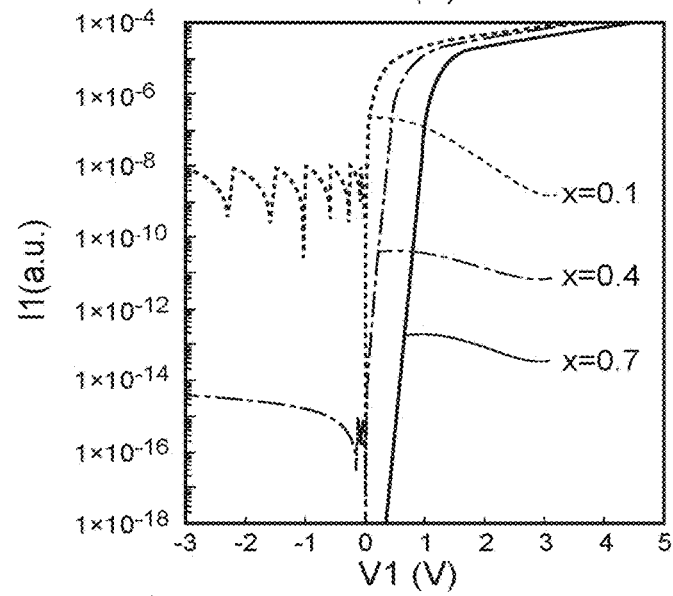
Figure 3C:
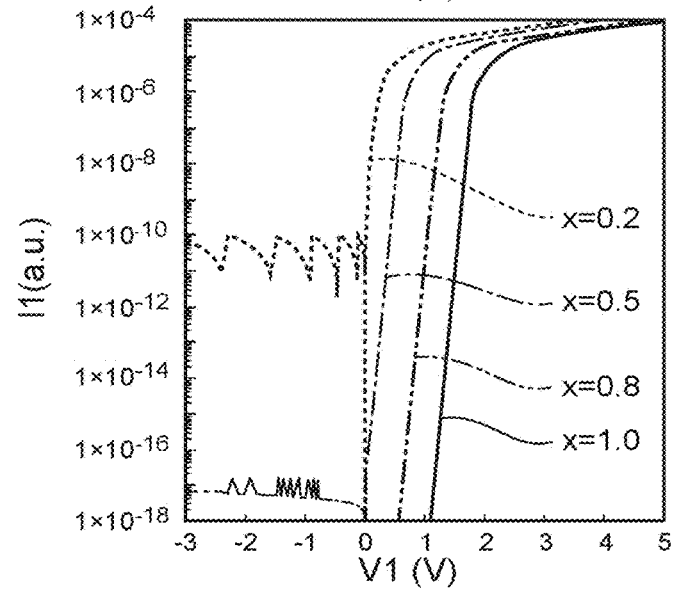

In these figures, the horizontal axis is a voltage V1 (V) applied between the first electrode 51 and the second electrode 52. The vertical axis is a current I1 (arbitrary units) flowing between the first electrode 51 and the second electrode 52. In FIG. 2A to FIG. 2C, the vertical axis is a linear scale. In FIG. 3A to FIG. 3C, the vertical axis is a logarithmic scale.

These figures show the simulation results of the characteristics of the semiconductor device 110 when changing the Al composition ratio x of the second semiconductor layer 20. FIG. 2A and FIG. 3A illustrate the characteristics when the Al composition ratio x is 0, 0.3, 0.6, and 0.9. FIG. 2B and FIG. 3B illustrate the characteristics when the Al composition ratio x is 0.1, 0.4, and 0.7. FIG. 2C and FIG. 3C illustrate the characteristics when the Al composition ratio x is 0.2, 0.5, 0.8, and 1.0. The first semiconductor layer 10 is 6H—SiC in the model of the simulation. A thickness t1 of the first semiconductor layer (referring to FIG. 1) is 340 μm. In the examples of FIG. 2A to FIG. 2C and FIG. 3A to FIG. 3C, the thickness t2 of the second semiconductor layer 20 is 500 nm. The n-type carrier concentration of the first semiconductor layer 10 is $2\times10^{18}$ cm$^{-3}$; and the n-type carrier concentration of the second semiconductor layer 20 is $1\times10^{17}$ cm$^{-3}$.

As shown in FIG. 2A to FIG. 2C, the current I1 is small when the voltage V1 is low. When the voltage V1 exceeds a designated value (a threshold), the current I1 increases as the voltage V1 increases. The voltage V1 being lower than the threshold corresponds to being OFF. The voltage V1 being the threshold or more corresponds to being ON. A rectifying characteristic is obtained in the semiconductor device 110. The semiconductor device 110 can function as a diode.

It can be seen from FIG. 3A to FIG. 3C that the current I1 in the OFF-state is insufficiently small when the Al composition ratio x of the second semiconductor layer 20 is low. For example, leakage occurs. For example, the current I1 that is sufficiently low (an OFF-current) is obtained when the Al composition ratio x is 0.5 or more.

In the embodiment, the second semiconductor layer 20 includes n-type $Al_xGa_{1-x}N$ (0.5≤x≤1). A rectifying characteristic that has good OFF-characteristics is obtained by such an Al composition ratio x. The leakage is suppressed.

It can be seen from FIG. 3A to FIG. 3C that the current I1 in the ON-state increases as the Al composition ratio x decreases. The threshold voltage increases as the Al composition ratio x increases.

It is considered that such a rectifying characteristic is obtained in the semiconductor device 110 due to the difference between the level of the conduction band of the first semiconductor layer 10 and the level of the conduction band of the second semiconductor layer 20. It is considered that the conduction characteristics change in a region including the interface of these layers by the band diagram changing according to the voltage V1.

For example, it is considered that the difference between the level of the conduction band of the first semiconductor layer and the level of the conduction band of the second semiconductor layer 20 is excessively small in the case where the Al composition ratio x of the second semiconductor layer 20 is excessively low. Thereby, it is considered that the leakage occurs easily. It is considered that the leakage is suppressed and the appropriate threshold characteristics are obtained by the appropriate Al composition ratio x.

Figure 4A:
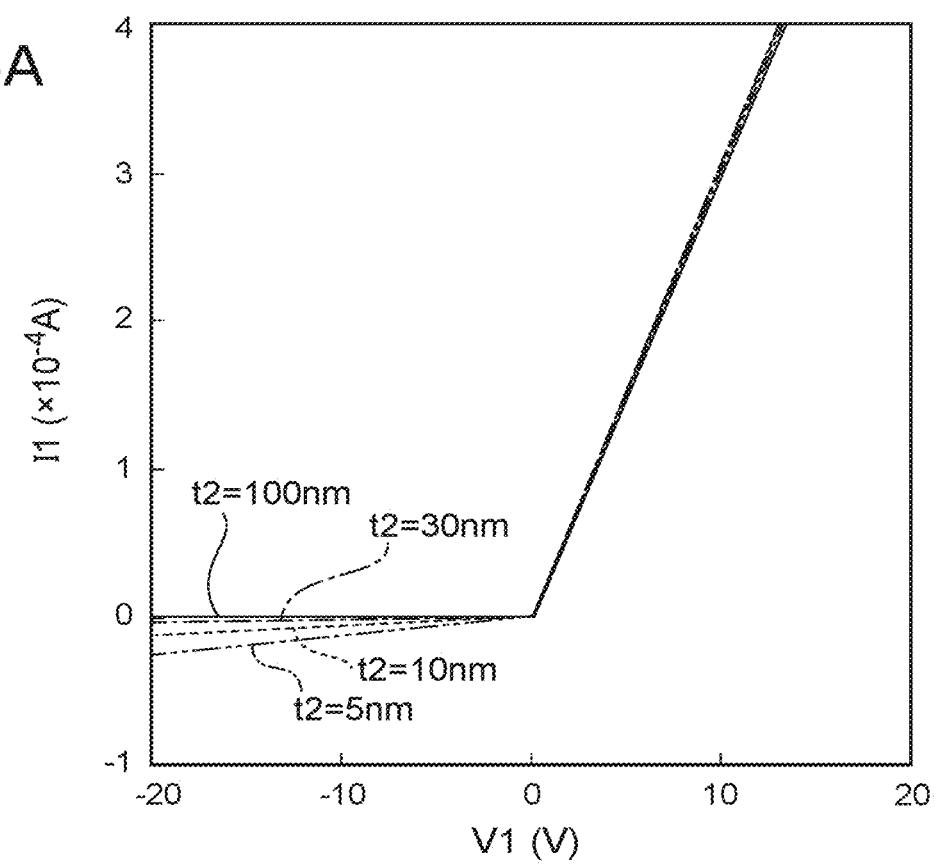
FIG. 4A and FIG. 4B are graphs illustrating characteristics of the semiconductor device according to the first embodiment.
Figure 4B:
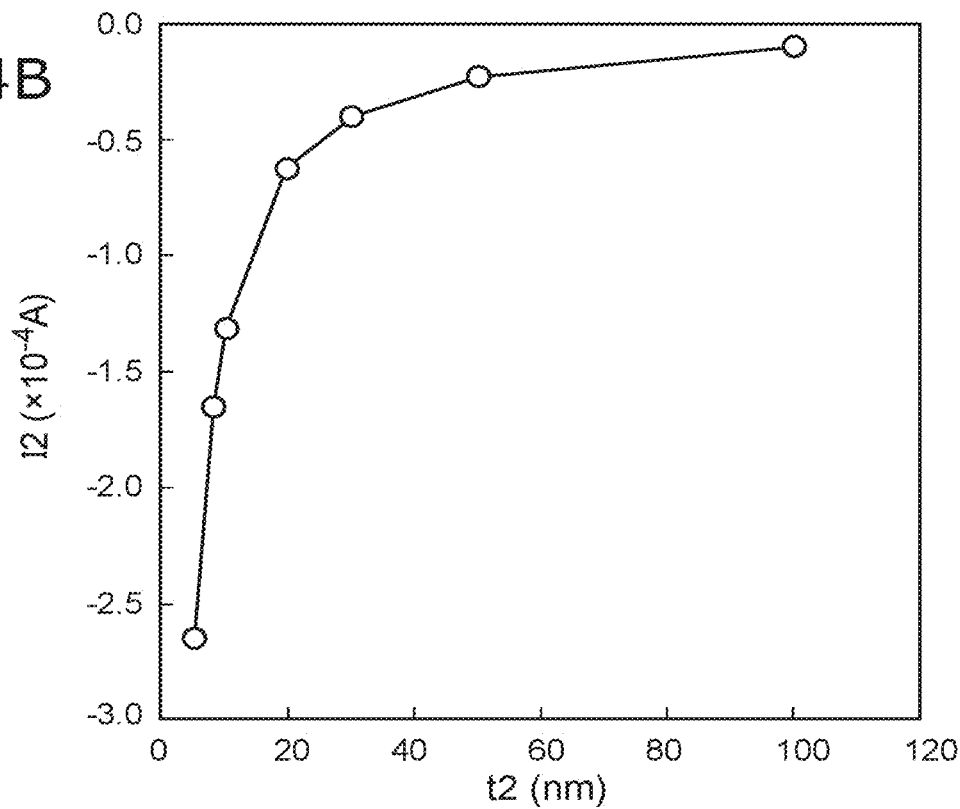

FIG. 4A and FIG. 4B are graphs illustrating characteristics of the semiconductor device according to the first embodiment.

The horizontal axis of FIG. 4A is the voltage V1 (V). The vertical axis is the current I1 (arbitrary units). In FIG. 4A, the vertical axis is a linear scale. FIG. 4A illustrates simulation results relating to the change of the characteristics when the thickness t2 of the second semiconductor layer 20 is modified. In the example of FIG. 4A, the second semiconductor layer 20 is AlN. In this model, the n-type carrier concentration of the first semiconductor layer 10 is $2\times10^{18}$ cm$^{-3}$; and the n-type carrier concentration of the second semiconductor layer 20 is $1\times10^{17}$ cm$^{-3}$.

It can be seen from FIG. 4A that the threshold voltage substantially does not change even when the thickness t2 is changed. The characteristics are substantially the same when the voltage V1 is the threshold voltage or more.

It can be seen from FIG. 4A that the absolute value of the current I1 is large when the voltage V1 is negative and the thickness t2 is thin (e.g., 5 nm). The leakage current is large. A current I2 is the current when the voltage V1 is −20 V. The current I2 corresponds to the leakage current. The current I2 has a negative value.

FIG. 4B shows the relationship between the thickness t2 and the current I2. In FIG. 4B, the horizontal axis is the thickness t2 (nm). The vertical axis is the current I2 (the leakage current). It can be seen from FIG. 4B that the absolute value of the current I2 is large when the thickness t2 is thin. For example, the absolute value of the current I2 is markedly large when the thickness t2 is 5 nm or less. The energy band profile between the first semiconductor layer 10 and the second semiconductor layer 20 bends due to the electric field due to the voltage V1. In the case where the thickness t2 is thin and the voltage V1 is negative, the width (the depletion layer width) of the energy barrier (the level difference) between the first semiconductor layer 10 and the second semiconductor layer 20 bends further in the direction of becoming narrower. It is considered that the carriers pass easily by overcoming the level difference of the energy. For example, the carriers pass easily due to at least one of a tunneling effect, thermionic emission, or a tunneling current via the defect state/interface state, etc. Therefore, it is considered that the absolute value of the current I2 is large when the thickness t2 is thin.

The absolute value of the current I2 is small when the thickness t2 is 10 nm or more. The absolute value of the current I2 is smaller when the thickness t2 is 20 nm or more. In the embodiment, it is favorable for the thickness t2 to be 10 nm or more. It is more favorable for the thickness t2 to be 20 nm or more. It is more favorable for the thickness t2 to be 30 nm or more.

According to experiments by the inventors, there is a tendency for the flatness of the surface of the second semiconductor layer 20 to degrade in the case where the thickness t2 of the second semiconductor layer 20 is excessively thin. There are cases where the leakage occurs easily due to such degradation of the flatness. Therefore, in the embodiment, it is favorable for the thickness t2 not to be excessively thin.

In the embodiment, it is favorable for the thickness t2 of the second semiconductor layer 20 to be not less than 10 nm and not more than 1 μm. By setting the thickness t2 to be 10 nm or more, for example, good flatness is obtained; and the leakage can be suppressed. By setting the thickness t2 to be 1 μm or less, for example, a low resistance is obtained.

According to experiments by the inventors, it was found that, when the thickness t2 of the second semiconductor layer 20 is 100 nm or less, good crystallinity of the second semiconductor layer 20 is obtained easier in the case where the second semiconductor layer 20 includes Si (an n-type impurity) than in the case where Si is not included. In the embodiment, the thickness t2 may be 100 nm or less.

The carrier concentration of the second semiconductor layer 20 is, for example, not less than $1 \times 10^{15}$ cm$^{-3}$ but less than $5 \times 10^{19}$ cm$^{-3}$. Thereby, it is easy for the current to flow appropriately in the second semiconductor layer 20.

The carrier concentration of the first semiconductor layer 10 is, for example, not less than $1 \times 10^{17}$ cm$^{-3}$ and not more than $1 \times 10^{19}$ cm$^{-3}$. Thereby, the resistance can be low.

The first semiconductor layer 10 includes, for example, at least one selected from the group consisting of 4H—SiC and 6H—SiC. In the embodiment, it is more favorable for the first semiconductor layer 10 to include 6H—SiC. Thereby, the lattice mismatch between the second semiconductor layer 20 and the first semiconductor layer 10 can be small; and better crystallinity is obtained easily. The surface of the first semiconductor layer 10 on the second semiconductor layer 20 side is, for example, the (0001) plane. This surface is, for example, the (0001) plane of 6H—SiC.

In the embodiment, the thickness t1 of the first semiconductor layer 10 (referring to FIG. 1) is, for example, not less than 10 nm and not more than 1 mm. Thereby, for example, the level difference of the bands between the first semiconductor layer 10 and the second semiconductor layer 20 can be ensured sufficiently. For example, the thickness t1 of the first semiconductor layer 10 may be, for example, not less than 300 μm and not more than 500 μm.

In one example, the first semiconductor layer 10 contacts the first electrode 51. For example, the first electrode 51 has an ohmic contact with the first semiconductor layer 10.

As shown in FIG. 1, the first electrode 51 may include a first conductive region 51a and a second conductive region 51b. The second conductive region 51b is provided between the first conductive region 51a and the first semiconductor layer 10 in the first direction (the Z-axis direction). The second conductive region 51b includes, for example, Ti. For example, the first electrode 51 may include a stacked film of Ti/Al/Ni/Au. For example, the first electrode 51 may include a stacked film of Ti/W. In such cases, the Ti film contacts the first semiconductor layer 10. In such a configuration, good ohmic contact is obtained easily between the first electrode 51 and the first semiconductor layer 10.

The second semiconductor layer 20 contacts the second electrode 52. For example, the second electrode 52 has an ohmic contact with the second semiconductor layer 20.

As shown in FIG. 1, the second electrode 52 may include a third conductive region 52c and a fourth conductive region 52d. The fourth conductive region 52d is provided between the third conductive region 52c and the second semiconductor layer 20 in the first direction (the Z-axis direction). For example, the fourth conductive region 52d includes Al.

A stacked film of Ti/Al/Ni/Au, etc., may be formed on the second semiconductor layer 20 as the second electrode 52. In such a case, the Ti film contacts the second semiconductor layer 20. After such a stacked film is formed, heat treatment at a high temperature is performed. The temperature of the heat treatment is, for example, 770° C. or more and is, for example, not less than 800° C. and not more than 850° C. (e.g., about 830° C.). Good ohmic contact is obtained easily by such heat treatment. When performing the heat treatment at such a high temperature, there are cases where mixing (mutual diffusion) of the metallic elements occurs inside the stacked film of Ti/Al/Ni/Au or the like recited above. Due to the heat treatment, for example, the region that includes the Al included in the stacked film contacts the second semiconductor layer 20. The region that includes the Al corresponds to the fourth conductive region 52d recited above. Good ohmic contact is obtained easily when such a fourth conductive region 52d is obtained.

In the embodiment, for example, the second semiconductor layer 20 is epitaxially grown on the first semiconductor layer 10.

In the embodiment, the first semiconductor layer 10 may include a SiC layer formed on any substrate. For example, the formation of the SiC layer is by epitaxial growth. The substrate may be removed after the formation of the SiC layer and the formation of the second semiconductor layer 20. The substrate may be, for example, a SiC substrate.

Figure 5:
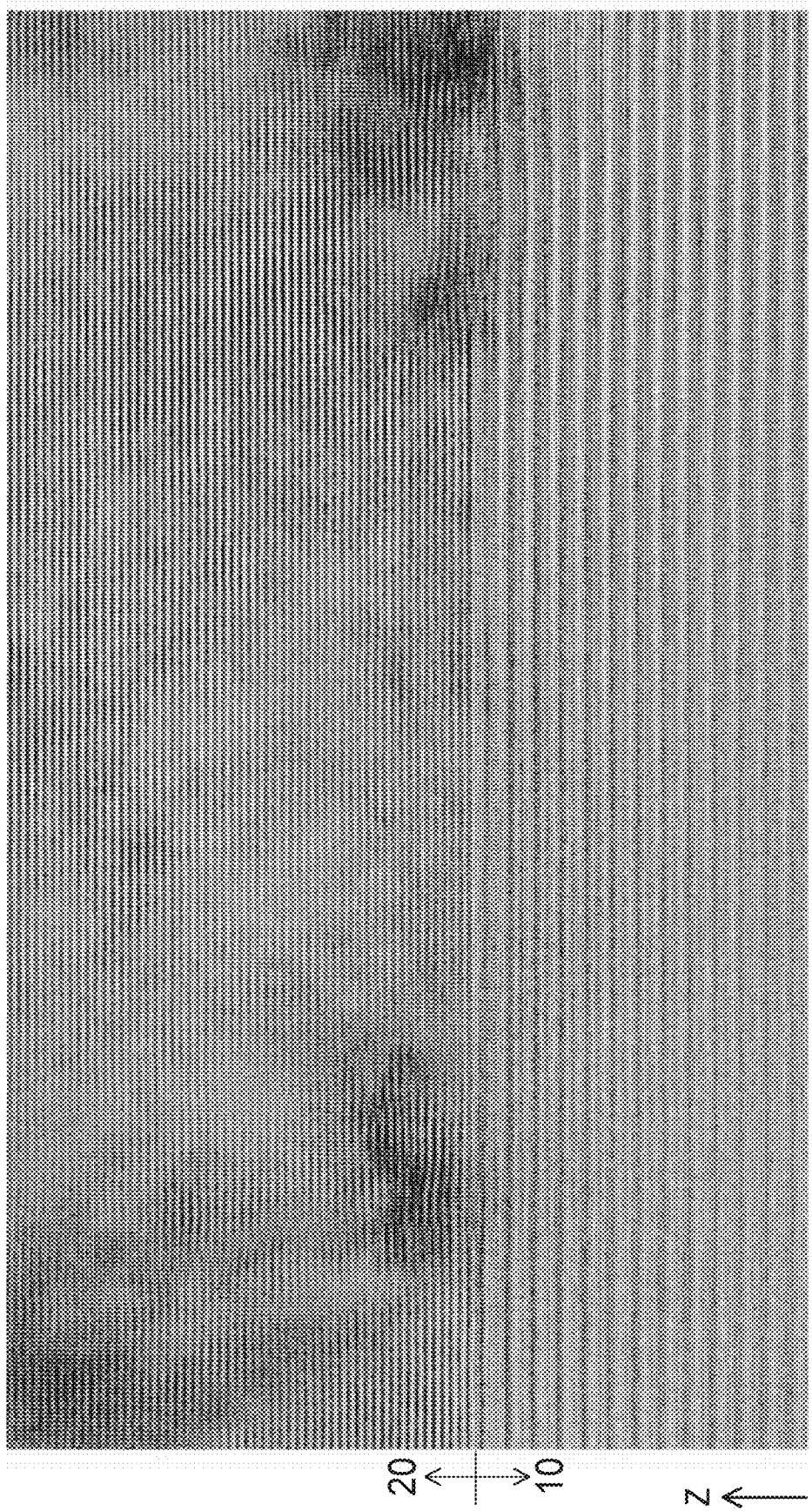
FIG. 5 is an electron microscope photograph of the semiconductor device according to the first embodiment.

FIG. 5 is an electron microscope photograph of the semiconductor device according to the first embodiment.

FIG. 5 is a cross-section TEM (Transmission Electron Microscope) image of a region including the interface between the first semiconductor layer 10 and the second semiconductor layer 20 of the semiconductor device 110. In the example, the second semiconductor layer 20 is AlN.

As shown in FIG. 5, an abrupt interface is obtained between the first semiconductor layer 10 and the second semiconductor layer 20. As shown in FIG. 5, a disturbance of the lattice is observed at the vicinity of the interface. The disturbance of the lattice is caused by the lattice mismatch between the first semiconductor layer 10 and the second semiconductor layer 20.

Figure 6:
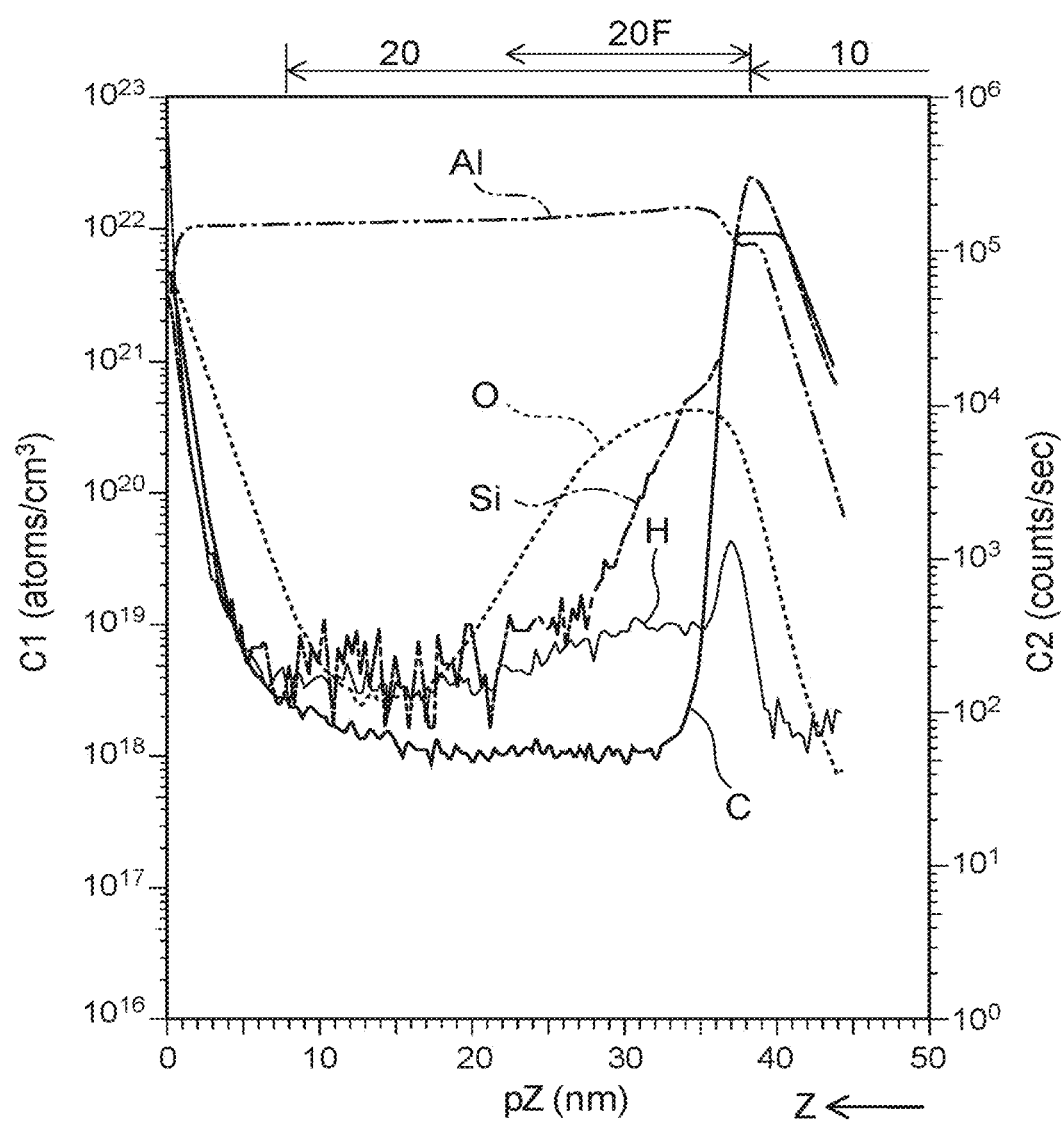
FIG. 6 is a graph illustrating the semiconductor device according to the first embodiment.

FIG. 6 is a graph illustrating the semiconductor device according to the first embodiment.

FIG. 6 shows an example of SIMS (Secondary Ion Mass Spectrometry) analysis results of a portion including the first semiconductor layer 10 and the second semiconductor layer 20. The horizontal axis of FIG. 6 is a position pZ (nm) in the Z-axis direction. The vertical axis on the left side shows a concentration C1 (atoms/cm$^3$) of the elements (hydrogen, carbon, oxygen, or silicon). The vertical axis on the right side is a detection concentration C2 (counts/sec) of Al. In the example, the second semiconductor layer 20 is AlN; and the thickness t2 is about 30 nm.

The detection concentration C2 of Al is high in the second semiconductor layer 20; and the detection concentration C2 of Al is low in the first semiconductor layer 10. The concentration C1 of Si is high in the first semiconductor layer 10; and the concentration C1 of Si is low in the second semiconductor layer 20.

As shown in FIG. 6, oxygen (O) and hydrogen (H) are detected in the region of the second semiconductor layer 20 proximal to the first semiconductor layer 10. The second semiconductor layer 20 includes an interface region 20F (referring to FIG. 6). The distance of the interface region 20F from the first semiconductor layer 10 is 15 nm or less. As shown in FIG. 6, the concentration of oxygen in at least a portion of the interface region 20F is higher than the concentration of hydrogen in the at least a portion of the interface region 20F recited above. The concentration of Si in the at least a portion of the interface region 20F recited above is lower than the concentration of oxygen recited above in the at least a portion of the interface region 20F recited above and higher than the concentration of hydrogen recited above in the at least a portion of the interface region 20F recited above. By such an element profile, for example, the leakage is suppressed easily when the negative voltage V1 is applied.

Figure 7:
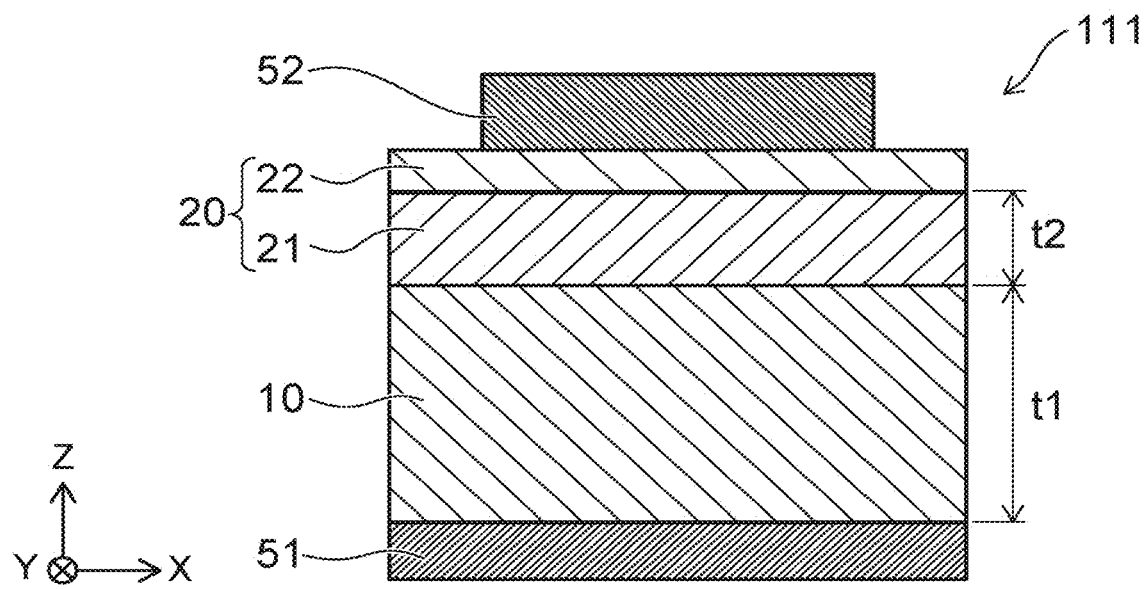
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, the semiconductor device 111 according to the embodiment also includes the first electrode 51, the second electrode 52, the first semiconductor layer 10, and the second semiconductor layer 20. In the semiconductor device 111, the second semiconductor layer 20 includes a first region 21 and a second region 22. Otherwise, for example, the configuration of the semiconductor device 111 is similar to the configuration of the semiconductor device 110. An example of the second semiconductor layer 20 of the semiconductor device 111 will now be described.

The second semiconductor layer 20 includes the first region 21 and the second region 22. The second region 22 is provided between the first region 21 and the second electrode 52 in the first direction (the Z-axis direction). For example, the second region 22 contacts the second electrode 52.

A second carrier concentration of the n-type in the second region 22 is higher than a first carrier concentration of the n-type in the first region 21. The first region 21 is, for example, an n$^-$-region. The second region 22 is, for example, an n$^+$-region. By such a configuration, better ohmic contact can be obtained easily between the second semiconductor layer 20 and the second electrode 52.

For example, the first carrier concentration is not less than $1 \times 10^{15}$ cm$^{-3}$ but less than $1 \times 10^{18}$ cm$^{-3}$. For example, the second carrier concentration is not less than $1 \times 10^{17}$ cm$^{-3}$ but less than $1 \times 10^{19}$ cm$^{-3}$.

Figure 8:
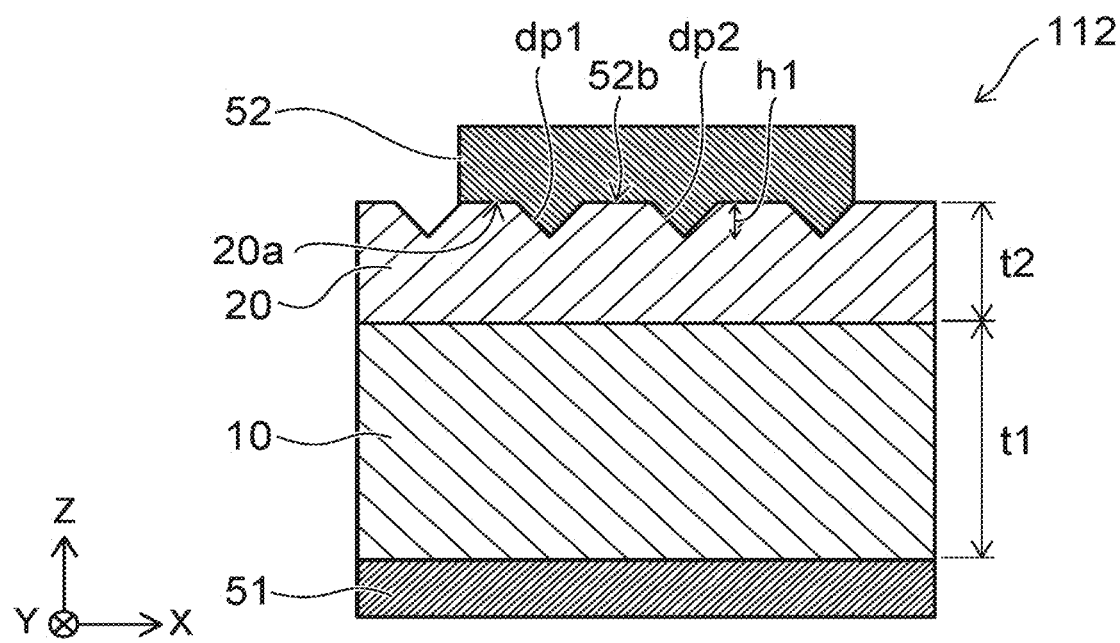
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, the semiconductor device 112 according to the embodiment also includes the first electrode 51, the second electrode 52, the first semiconductor layer 10, and the second semiconductor layer 20. In the semiconductor device 112, an unevenness is provided in the surface of the second semiconductor layer 20 on the second electrode 52 side. Otherwise, for example, the configuration of the semiconductor device 112 is similar to the configuration of the semiconductor device 110. An example of the second semiconductor layer 20 of the semiconductor device 112 will now be described.

The second semiconductor layer 20 has a first surface 20a. The first surface 20a opposes the second electrode 52. The first surface 20a has a first unevenness dp1. A height h1 of the first unevenness dp1 is not less than 1 nm and not more than 200 nm. The height h1 of the first unevenness dp1 may be 10 nm or more. The height h1 of the first unevenness dp1 may be 20 nm or more. For example, the first unevenness dp1 is obtained by forming a film used to form the second semiconductor layer 20 and by subsequently removing a portion of the film. The first unevenness dp1 may have an unevenness that is a morphological nonuniformity of the surface. The first unevenness dp1 may include V-pits. Facet surfaces may be formed in the first unevenness dp1.

The second electrode 52 has a second surface 52b. The second surface 52b opposes the first surface 20a. The second surface 52b has a second unevenness dp2. The second unevenness dp2 is along the first unevenness dp1. For example, the second unevenness dp2 can be formed by filling, into the first unevenness dp1, a film used to form the second electrode 52.

The contact surface area between the second semiconductor layer 20 and the second electrode 52 is increased by the first unevenness dp1 and the second unevenness dp2. Thereby, the resistance can be reduced. For example, better ohmic contact is obtained easily.

The first region 21 and the second region 22 may be provided in the semiconductor device 112 as well.

Second Embodiment

Figure 9:
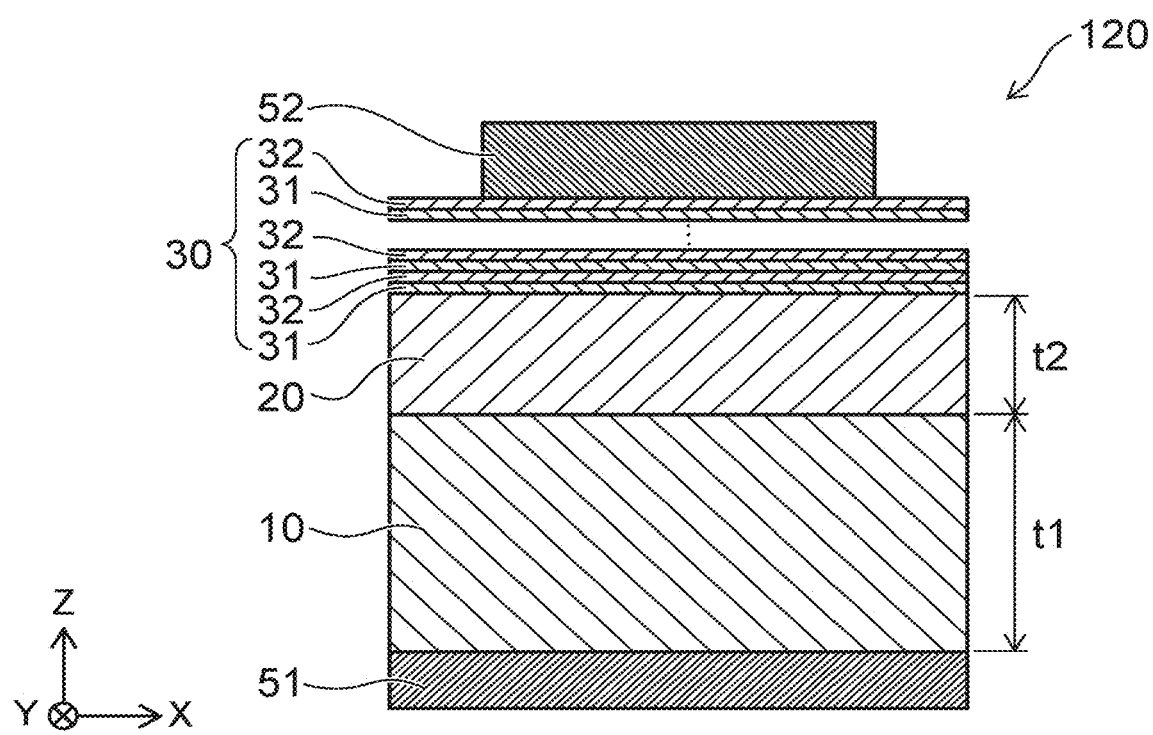
FIG. 9 is a schematic cross-sectional view illustrating a semiconductor device according to a second embodiment.

FIG. 9 is a schematic cross-sectional view illustrating a semiconductor device according to a second embodiment.

As shown in FIG. 9, the semiconductor device 120 according to the embodiment includes the first electrode 51, the second electrode 52, the first semiconductor layer 10, the second semiconductor layer 20, and a third semiconductor layer 30.

The second electrode 52 is separated from the first electrode 51 in the first direction (the Z-axis direction).

The first semiconductor layer 10 is provided between the first electrode 51 and the second electrode 52. The first semiconductor layer 10 is electrically connected to the first electrode 51. The first semiconductor layer 10 includes n-type SiC.

The second semiconductor layer 20 is provided between the first semiconductor layer 10 and the second electrode 52. The second semiconductor layer 20 contacts the first semiconductor layer 10. The second semiconductor layer 20 includes n-type Al$_x$Ga$_{1-x}$N (0.5≤x≤1). The thickness t2 of the second semiconductor layer 20 is not less than 10 nm and not more than 1 μm.

The third semiconductor layer 30 is provided between the second semiconductor layer 20 and the second electrode 52. The third semiconductor layer 30 includes multiple first semiconductor films 31 and multiple second semiconductor films 32 provided alternately along the first direction (the Z-axis direction). The multiple first semiconductor films 31 include n-type Al$_y$Ga$_{1-y}$N (0<y≤1). The multiple second semiconductor films 32 include Al$_z$Ga$_{1-z}$N (0≤z<y). The thickness in the first direction one of the multiple first semiconductor films 31 is not less than 1 nm and not more than 5 nm. When the thickness of the first semiconductor film 31 is 5 nm or less, for example, a tunneling effect is obtained appropriately. The thickness in the first direction one of the multiple second semiconductor films 32 is not less than 1 nm and not more than 10 nm. By setting the second semiconductor film 32 not to be excessively thick, for example, the lattice mismatch with the second semiconductor layer 20 is suppressed easily.

For example, the multiple first semiconductor films 31 may be AlGaN films or AlN films. The multiple second semiconductor films 32 may be, for example, GaN films.

In the semiconductor device 120, the first semiconductor layer 10 and the second semiconductor layer 20 function as functional elements (diodes) having rectifying characteristics. The third semiconductor layer 30 functions as an intermediate layer for obtaining good ohmic contact characteristics with the second electrode 52. Due to the multiple first semiconductor films 31 and the multiple second semiconductor films 32 provided in the third semiconductor layer 30, the carriers can move by overcoming the difference of the bands of these semiconductor films.

A rectifying characteristic is obtained in the semiconductor device 120 as well. According to the embodiment as well, a semiconductor device can be provided in which the structure can be simple.

The configurations described in reference to the semiconductor devices 110 to 112 are applicable to the first electrode 51, the second electrode 52, the first semiconductor layer 10, and the second semiconductor layer 20 of the semiconductor device 120.

According to the first and second embodiments, for example, a monopolar heterojunction diode can be provided. For example, it is not practically easy to control the n-type and the n-type in a nitride semiconductor. In particular, it is difficult to obtain a p-type semiconductor having stable characteristics. For example, it is difficult to obtain good crystallinity. In the embodiment, for example, a diode that has a simple structure and good characteristics (e.g., high quality and high breakdown voltage) can be provided by the n-type first semiconductor layer 10 and the n-type second semiconductor layer 20. In the embodiment, because the first semiconductor layer 10 includes SiC, for example, good heat dissipation is obtained compared to the case where the first semiconductor layer 10 includes a nitride semiconductor. In the embodiment, for example, the lattice constant difference (the lattice mismatch) between the first semiconductor layer 10 and the second semiconductor layer 20 is small. Good quality is obtained at the second semiconductor layer 20 and at the interface between the first semiconductor layer 10 and the second semiconductor layer 20 (referring to FIG. 5). For example, a band profile sufficient for obtaining a good rectifying property is obtained easily.

According to the embodiments, a semiconductor device can be provided in which the structure can be simple.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode separated from the first electrode in a first direction;
a first semiconductor layer including n-type SiC, being provided between the first electrode and the second electrode, and being electrically connected to the first electrode; and
a second semiconductor layer contacting the first semiconductor layer and the second electrode, being provided between the first semiconductor layer and the second electrode, and including n-type $Al_xGa_{1-x}N$ ($0.5 \le x \le 1$), a thickness of the second semiconductor layer being not less than 10 nm and not more than 1 μm.

2. The device according to claim 1, wherein
the second semiconductor layer has a first surface opposing the second electrode,
the first surface has a first unevenness having a height of not less than 1 nm and not more than 200 nm,
the second electrode has a second surface opposing the first surface, and
the second surface has a second unevenness along the first unevenness.

3. The device according to claim 1, wherein
the second semiconductor layer includes a first region and a second region, the second region being between the first region and the second electrode in the first direction, and
a second carrier concentration of the n-type in the second region is higher than a first carrier concentration of the n-type in the first region.

4. The device according to claim 3, wherein
the first carrier concentration is not less than $1 \times 10^{15}$ cm$^{-3}$ but less than $1 \times 10^{18}$ cm$^{-3}$, and
the second carrier concentration is not less than $1 \times 10^{17}$ cm$^{-3}$ but less than $1 \times 10^{19}$ cm$^{-3}$.

5. The device according to claim 1, wherein a carrier concentration of the second semiconductor layer is not less than $1 \times 10^{15}$ cm$^{-3}$ but less than $5 \times 10^{19}$ cm$^{-3}$.

6. The device according to claim 1, wherein a carrier concentration of the first semiconductor layer is not less than $1 \times 10^{17}$ cm$^{-3}$ and not more than $1 \times 10^{19}$ cm$^{-3}$.

7. The device according to claim 1, wherein the first semiconductor layer includes 6H—SiC.

8. The device according to claim 1, wherein
the first electrode includes:
a first conductive region; and
a second conductive region including Ti and being provided between the first conductive region and the first semiconductor layer in the first direction.

9. The device according to claim 1, wherein the second electrode includes:
a third conductive region; and
a fourth conductive region including Al and being provided between the third conductive region and the second semiconductor layer in the first direction.

10. The device according to claim 1, wherein
the second semiconductor layer includes an interface region, a distance of the interface region from the first semiconductor layer being 15 nm or less, and
a concentration of oxygen in at least a portion of the interface region is higher than a concentration of hydrogen in the at least a portion of the interface region.

11. The device according to claim 10, wherein a concentration of Si in the at least a portion of the interface region is lower than the concentration of oxygen in the at least a portion of the interface region and higher than the concentration of hydrogen in the at least a portion of the interface region.

12. A semiconductor device, comprising:
a first electrode;
a second electrode separated from the first electrode in a first direction;
a first semiconductor layer including n-type SiC, being provided between the first electrode and the second electrode, and being electrically connected to the first electrode;
a second semiconductor layer contacting the first semiconductor layer, being provided between the first semiconductor layer and the second electrode, and including n-type $Al_xGa_{1-x}N$ ($0.5 \leq x \leq 1$), a thickness of the second semiconductor layer being not less than 10 nm and not more than 1 μm; and
a third semiconductor layer provided between the second semiconductor layer and the second electrode, the third semiconductor layer including a plurality of first semiconductor films and a plurality of second semiconductor films provided alternately along the first direction, the plurality of first semiconductor films including n-type $Al_yGa_{1-y}N$ ($0 < y \leq 1$), the plurality of second semiconductor films including $Al_zGa_{1-z}N$ ($0 \leq z < y$), a thickness in the first direction of one of the plurality of first semiconductor films being not less than 1 nm and not more than 5 nm, a thickness in the first direction of one of the plurality of second semiconductor films being not less than 1 nm and not more than 10 nm.

* * * * *